(12) United States Patent
Hellberg (10) Patent No.: US 7,586,428 B2
(45) Date of Patent: Sep. 8, 2009

(54) NON-LINEAR PROCESSING OF SIGNALS

(75) Inventor: Lars Richard Birger Hellberg, Huddinge (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 85 days.

(21) Appl. No.: 11/816,961

(22) PCT Filed: Feb. 25, 2005

(86) PCT No.: PCT/SE2005/000281

§ 371 (c)(1),
(2), (4) Date: Aug. 23, 2007

(87) PCT Pub. No.: WO2006/091134

PCT Pub. Date: Aug. 31, 2006

(65) Prior Publication Data

US 2008/0150774 A1   Jun. 26, 2008

(51) Int. Cl.
*H03M 1/00* (2006.01)

(52) U.S. Cl. ...................................... 341/138; 375/294
(58) Field of Classification Search ................. 341/138, 341/144, 147, 110; 375/376, 373, 327, 294
See application file for complete search history.

(56) References Cited

U.S. PATENT DOCUMENTS 7,391,842 B1 * 6/2008 Melanson .................... 375/376
7,466,760 B2 * 12/2008 Sorrells et al. .............. 375/294

* cited by examiner

*Primary Examiner*—Rexford N Barnie
*Assistant Examiner*—Joseph Lauture
(74) *Attorney, Agent, or Firm*—Roger S. Burleigh (57) ABSTRACT

In a non-linear processing system, the main non-linear processing and filtering is performed with low precision in a separate branch. A low-precision version (22) of the input signal (14) is created in an extractor (20), which is processed non-linearly in a low-precision non-linear processing unit (11) under constraints put on the non-linear processing. Quantisation errors or other artefacts, created by the use of low precision signals are finally removed by a precision restoring processing in a precision restoring unit (26) using the full-precision signal (14).

16 Claims, 6 Drawing Sheets

NON-LINEAR PROCESSING OF SIGNALS

TECHNICAL FIELD

The present invention relates in general to non-linear processing of signals, and in particular to multi-stage digital non-linear processing of signals.

BACKGROUND

In many systems, in particular in radio communications, there is a need to process a signal non-linearly. The objective is typically that the signal should stay within certain constant or signal-dependent boundaries. It is often desirable that the signal also is kept within a certain bandwidth, so that it does not spill over into adjacent channels or exceeds spectral emission limits.

High-performance non-linear processing often requires a number of processing stages, which results in high hardware use and high power consumption. Often, high sample rates are also needed, which further increases the requirements in terms of power and hardware. Many operations per sample at high sample rate require a lot of power. Furthermore, high sample rate also requires large number of gates, in turn leading to large chip area, i.e. high hardware consumption. Some prior art systems recognise that this may be a problem in certain applications, and suggestions leading to reduced number of processing stages and/or reduced required sample rate without significantly reducing the signal quality have been presented, which aim to bring down the power consumption to more manageable levels.

SUMMARY

Despite efforts in prior art, there is a general problem for high-speed, high-precision, digital implementations of multi-stage nonlinear processing and filtering that the power consumption is too high and the amount of required hardware is to large.

A general object of the present invention is to provide methods and devices providing improved non-linear processing of signals. A further object of the present invention is to provide non-linear processing methods and devices with reduced power consumption and/or reduced need of hardware.

The above objects are achieved by methods and devices according to the enclosed claims. In general words, the present invention performs band-limited non-linear processing and filtering of signals with reduced precision in a separate processing branch. A low-precision version of the input signal is created, which is processed non-linearly under constraints put on the non-linear processing. Quantisation errors and/or other artefacts, created by the low precision are finally compensated by a precision restoring processing. The precision restoring processing uses a delayed full-precision signal, to which an extracted modification based on the low-precision processed signal is added.

Low precision, i.e. in a digital signal a low numbers of bits for each value, gives low power consumption since the size of multipliers, adders, and other hardware can be smaller, for the same sample rate and clock frequency. For example, the size, i.e. the number of gates, of a multiplier scales with the number of bits squared. However, using low numbers of bits for signal samples and filter taps increases quantisation noise, which generally corrupts the output signal. The detrimental effect of high quantisation noise is avoided in the invention by restoring precision, after the low-precision processing is done, in the end of the chain. Statistical properties of the signals give rise to useful properties of the quantisation noise that are better exploited in the invention than in prior solutions.

An advantage with the present invention is that hardware requirements are reduced and power consumption is reduced, while the high performance of the original method is retained.

BRIEF DESCRIPTION OF THE DRAWINGS

The invention, together with further objects and advantages thereof, may best be understood by making reference to the following description taken together with the accompanying drawings, in which.

DETAILED DESCRIPTION

The present invention decreases the power consumption and the number of gates needed for certain band-limited non-linear modifications of signals. This is achieved by using reduced precision in a separate processing branch and restoring precision in the end by using a delayed high-precision signal to which only the extracted modification is added, after it has been filtered to reduce quantisation noise outside the allowed channels.

Figure 1A:
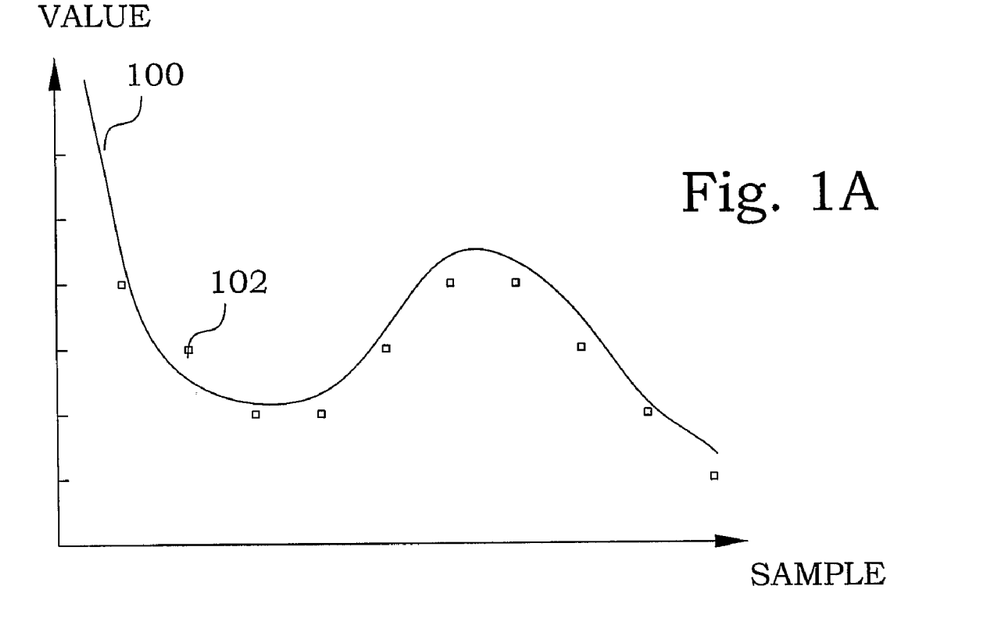
FIGS. 1A-B are diagrams illustrating the effect of changing precision in a digital representation of a signal.
Figure 1B:
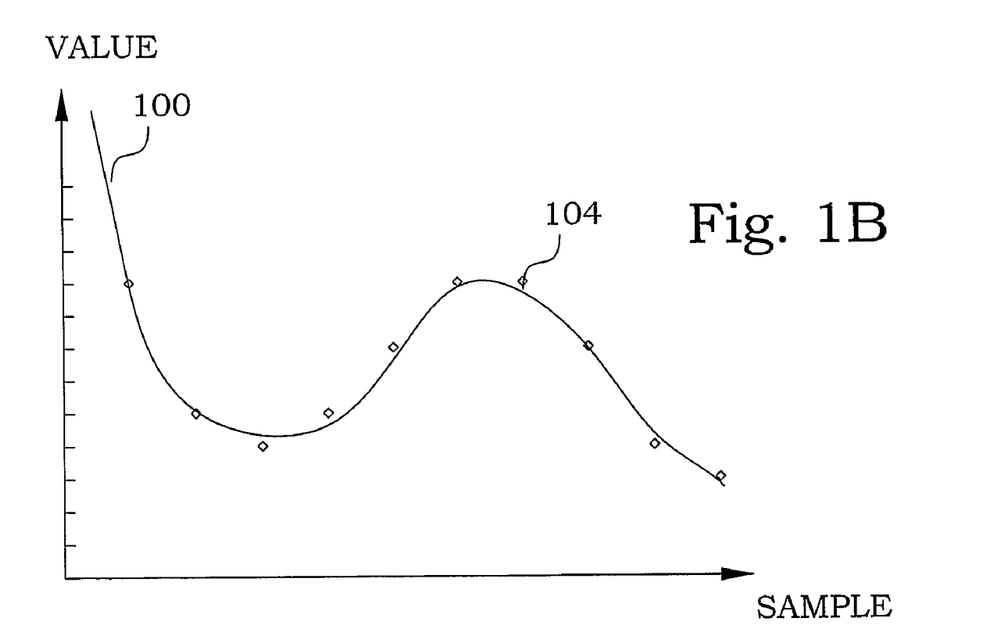

Quantisation noise arises as a result of insufficient resolution when using a representation of a signal. These problems are mainly concerning digital signals, where a sample is represented by a certain number of bits. A high number of bits allows for a more precise representation of the original signal, whereas a lower number of bits generally introduces larger discrepancies. In FIG. 1A, a continuous curve 100 is illustrated, which represents a continuous signal. The signal is digitised using a precision indicated along the vertical axis, giving a number of samples 102, represented by the small squares. In the example, the number of bits representing each value is increased by one. As easily is noted, the quantisation results in certain discrepancies between the original continuous signal and the digital values. By using a higher resolution, i.e. a higher precision in the quantisation, such as illustrated in FIG. 1B, the errors become smaller. The small diamonds 104 representing the digital values with a higher precision come in general closer to the true signal value.

Similar effects are occurring during processing of digital signals. A signal having a high precision, i.e. having a high resolution in values representing the signal, gives a more reliable result than a signal having a lower precision. Such quantisation noise is always present in digital processing, but becomes worse when the number of representing bits is lower.

In the present invention, quantisation noise due to low numbers of bits in the non-linear processing is treated in the same way as the non-linear modifications, in that much more of it can be allowed in certain frequency bands. Usually they are those that the original signal occupies, i.e. the channels. The problem of high quantisation noise is thus split in two problems, in-band and out-of-band, which are solved separately.

In addition, the non-linear modifications themselves are of large scale, when they occur. The performance of the original method is therefore relatively unimpaired by large in-band quantisation noise, i.e. except for ACPR and spectral emission, that occurs coincidentally with the non-linear modifications. Low precision does thus not add much to the size of the error vector magnitude or similar measure.

The intermittent nature of the peaks or similar features is also useful, since it with a favourable implementation gives intermittent quantisation noise, with zero quantisation noise in the output most of the time. The output of a filter, especially an FIR filter, decays to zero after about half the filter length after a signal peak has passed. Thus, most of the output of the filters will be zero in many applications. This is the reason the required number of bits in the non-linear processing branch is lower than expected.

Figure 2:
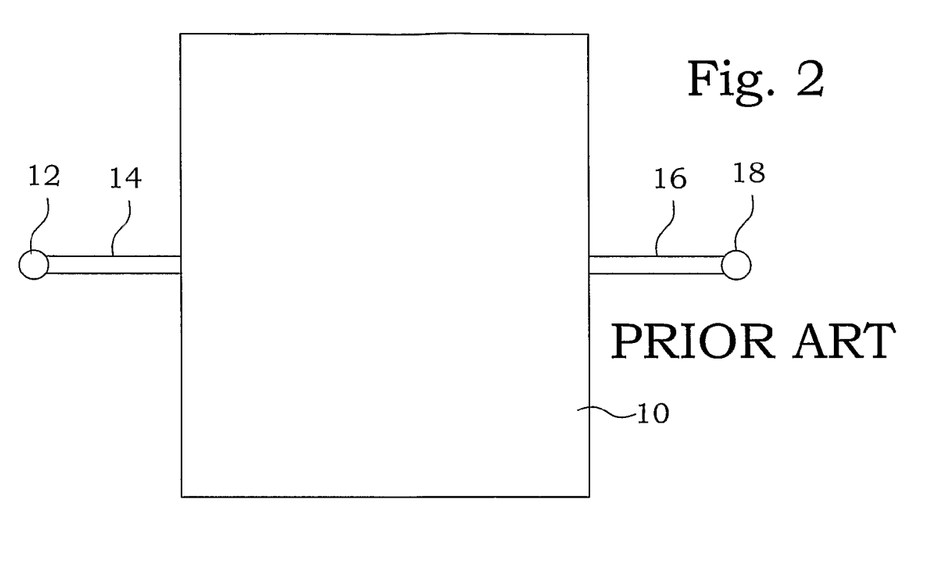
FIG. 2 is a block scheme of an embodiment of a prior art non-linear processing system.

FIG. 2 illustrates an embodiment of a general non-linear processing device according to prior art. An input 12 receives an input signal 14 having a relatively high precision, i.e. has a fairly large number n of bits representing each sample. A non-linear processing portion 10 operates on the n-bit signal and due to the relatively large number of bits the size of the components in the non-linear processing portion 10 has to be relatively large. The resulting processed n-bit signal 16 is provided to an output 18.

Figure 3:
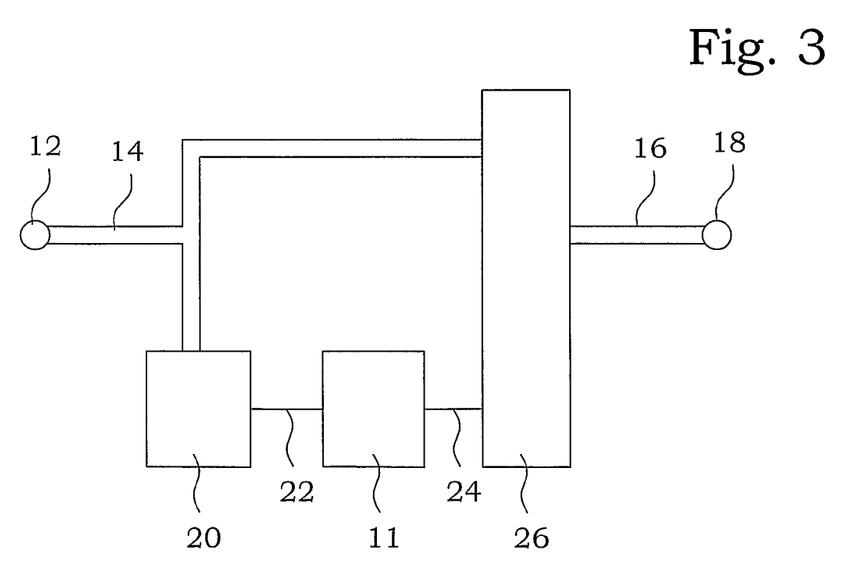
FIG. 3 is a block scheme of an embodiment of a non-linear processing system according to the present invention.

FIG. 3 illustrates an embodiment of a non-linear processing device according to the present invention. A digital signal is assumed in this embodiment. An input 12 receives an input signal 14 represented by n bits. The input signal 14 is connected to an extractor 20. The extractor 20 is arranged for providing a low-precision input signal 22 representative of the input signal 14. The low-precision input signal 22 has thus a reduced precision compared to the input signal 14, but represents the same original signal. The samples of the low-precision input signal 22 are represented by k bits, where k<n. In the figure, connections communicating n-bits signals are drawn as thick unfilled connections, while connections communicating k-bits signals are drawn by a single narrow line.

A low-precision non-linear processor 11 is connected to the low-precision input signal 22. The low-precision non-linear processor 11 is arranged to operate under the same constraints as the non-linear processor 10 of FIG. 2, however, on a signal containing fewer bits. Since the low-precision non-linear processor 11 operates on low-precision signals, it can be much smaller and less power consuming than the non-linear processor 10 of FIG. 2. The output from the low-precision non-linear processor 11 produces a non-linearly processed low-precision signal 24, which e.g. comprises different quantisation noise.

The non-linearly processed low-precision signal 24 and the input signal 14 are both connected to a precision restoring processor 26. In this precision restoring processor 26, a reference signal based on the original input signal 14 and the non-linearly processed low-precision signal 24 used to produce a precision restored processed signal 16 of n bits. In a preferred embodiment, a difference between the non-linear processed low-precision signal 24 and the reference signal, in a typical case a delayed version of the original signal or a function thereof, is filtered with high precision. The filtered difference is then added to the reference signal to provide a processed n-bit signal 16 to an output 18.

The ideas of the present invention can advantageously be implemented in many different systems. One example is Peak-to-average ratio (PAR) reduction, also known as decresting or clipping. (PAR) reduction increases efficiency and average output power of a Power Amplifier (PA). The objective is to reduce the peak amplitude excursions of the output signal while keeping the spectrum expansion within specified limits of spectral mask and adjacent channel power ratio (ACPR) specifications. At the same time in-band error are kept within specified limits, e.g. error vector magnitude (EVM) specifications.

Figure 4:
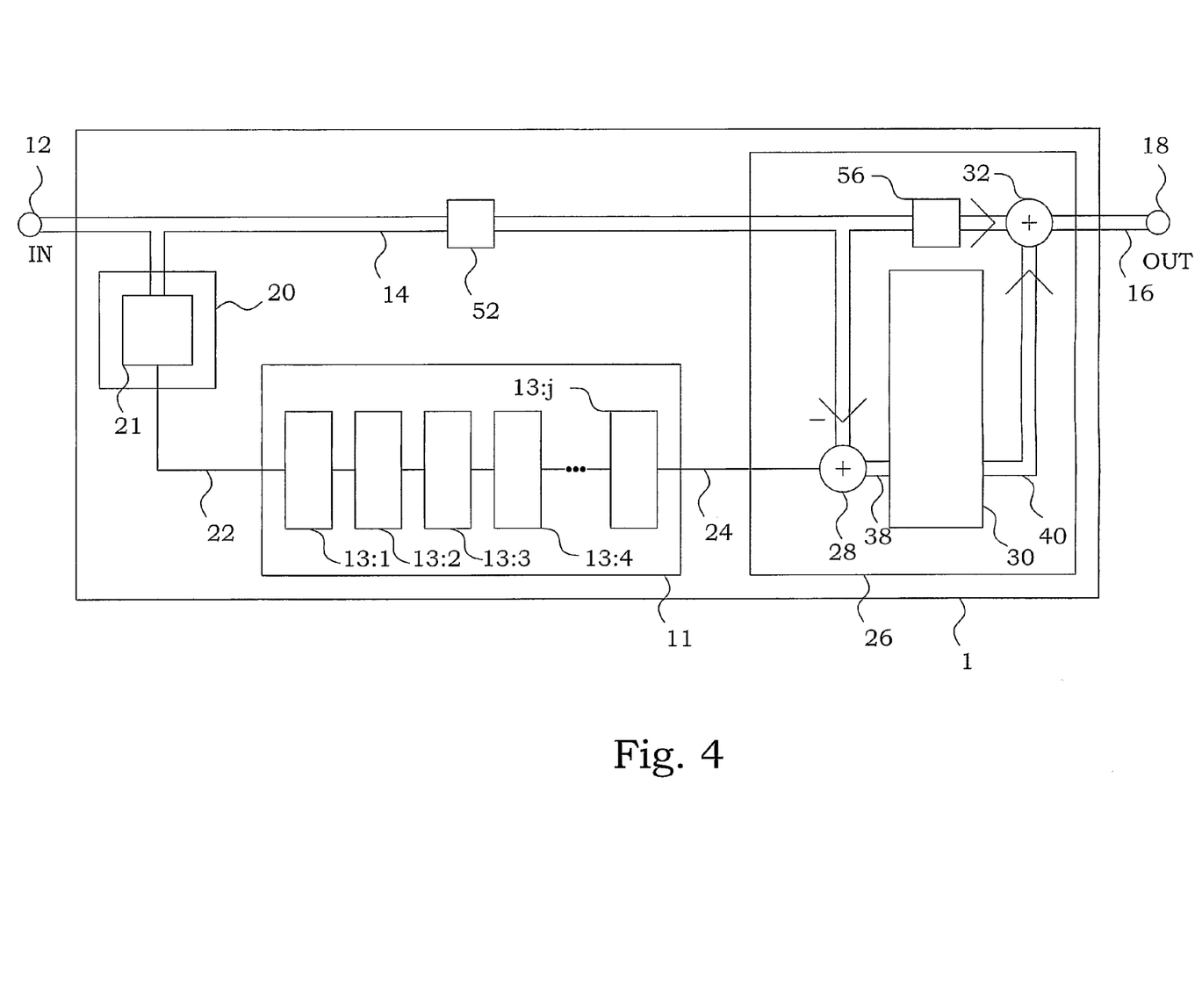
FIG. 4 is a block scheme of an embodiment of a peak-to-average ratio (PAR) reduction system according to the present invention.

An implementation of the invention in a PAR reduction application is shown in FIG. 4. An input 12 receives an input signal 14 having n-bits samples. The input signal 14 is provided to the extractor 20, which in this embodiment comprises a block 21 extracting the k Most Significant Bits (MSBs) of the n bits of the input signal 14, giving the low-precision input signal 22. The low-precision input signal 22 is provided to the low-precision non-linear processor 11, which in this embodiment performs signal clipping. The non-linear processed low-precision signal 24 is provided to the precision restoring processor 26, which restores precision and produces a processed n-bit signal 16 on the output 18.

The low-precision non-linear processor 11 comprises in this embodiment a number of successive clipping-filtering blocks 13:1-13:j. In each clipping-filtering block 13:1-13:j, the low-precision k-bit input signal 22 is successively adapted to a target clipped signal shape. However, in each clipping-filtering block 13:1-13:j, quantisation noise is introduced.

The precision restoring processor 26 receives the processed low-precision signal 24. A final peak extraction block 28 subtracts the n-bit input signal 14 from the processed low-precision signal 24, giving a difference signal 38. This difference signal is precision filtered, using all n bits in a filter 30, producing a peak suppression signal 40. Finally, the processed n-bit signal 16 is produced by adding the input signal 14 and the peak suppression signal 40 in an addition block 32.

A first delay block 52 causes the n-bit input signal 14 to be in step with the non-linearly processed/filtered signal 24 in the final peak extraction block 28. A second delay block 56 delays the n-bit signal further to be in step with the peak suppression signal 40 at the addition block 32, that puts together the final output signal 16.

Alternatively, the low precision (k-bit) signal 22, taken after the kMSBs block and properly delayed, can be used for final peak extraction. The n-bit signal taken after the first delay block 52 can then be converted to k-bit (or some other number of bits, such as k+2 bits) form before use in the final peak extraction.

The present invention can also advantageously be implemented in dynamic drain bias systems. The objective in such a system is to keep the drain terminal voltage as little above the minimum needed to maximise efficiency, while restricting its bandwidth. The minimum drain is typically largely proportional to the envelope of the amplified signal. A lower bandwidth gives increased efficiency in drain voltage amplifier, which usually is switch-mode.

Figure 5A:
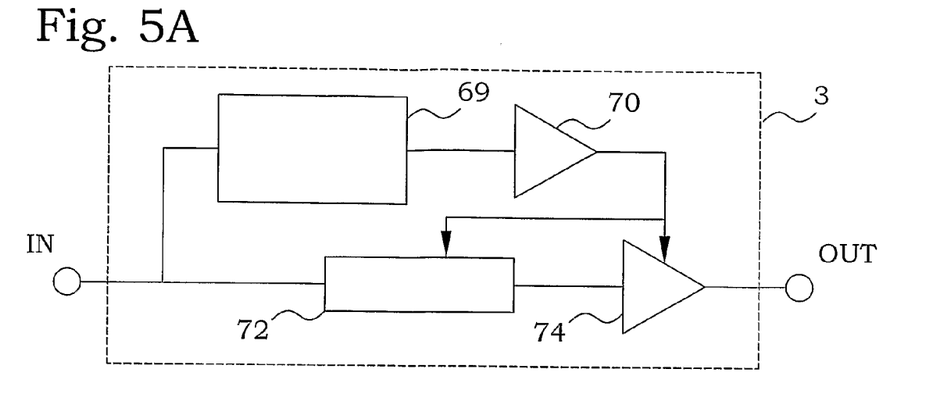
FIG. 5A is a block scheme of an embodiment of a amplifier arrangement of an envelope elimination and restoration (EER) type.

A general dynamic drain bias system 3 is illustrated in FIG. 5A. In input signal to be amplified is received at an input terminal IN. An input signal is provided to a non-linear processing unit, in this embodiment an envelope signal unit 69. The envelope signal is typically amplified in an envelope amplifier 70. A dynamic compensator 72 processes the input signal to produce a signal to be amplified. The amplified envelope signal is used as drain voltage in an amplifier 74 for the signal to be amplified. The dynamic compensator 72 is in this embodiment preferably dynamically compensating the amplitude and phase of the signal to be amplified for variations in the envelope signal, to typically obtain a linearly amplified output signal.

Figure 5B:
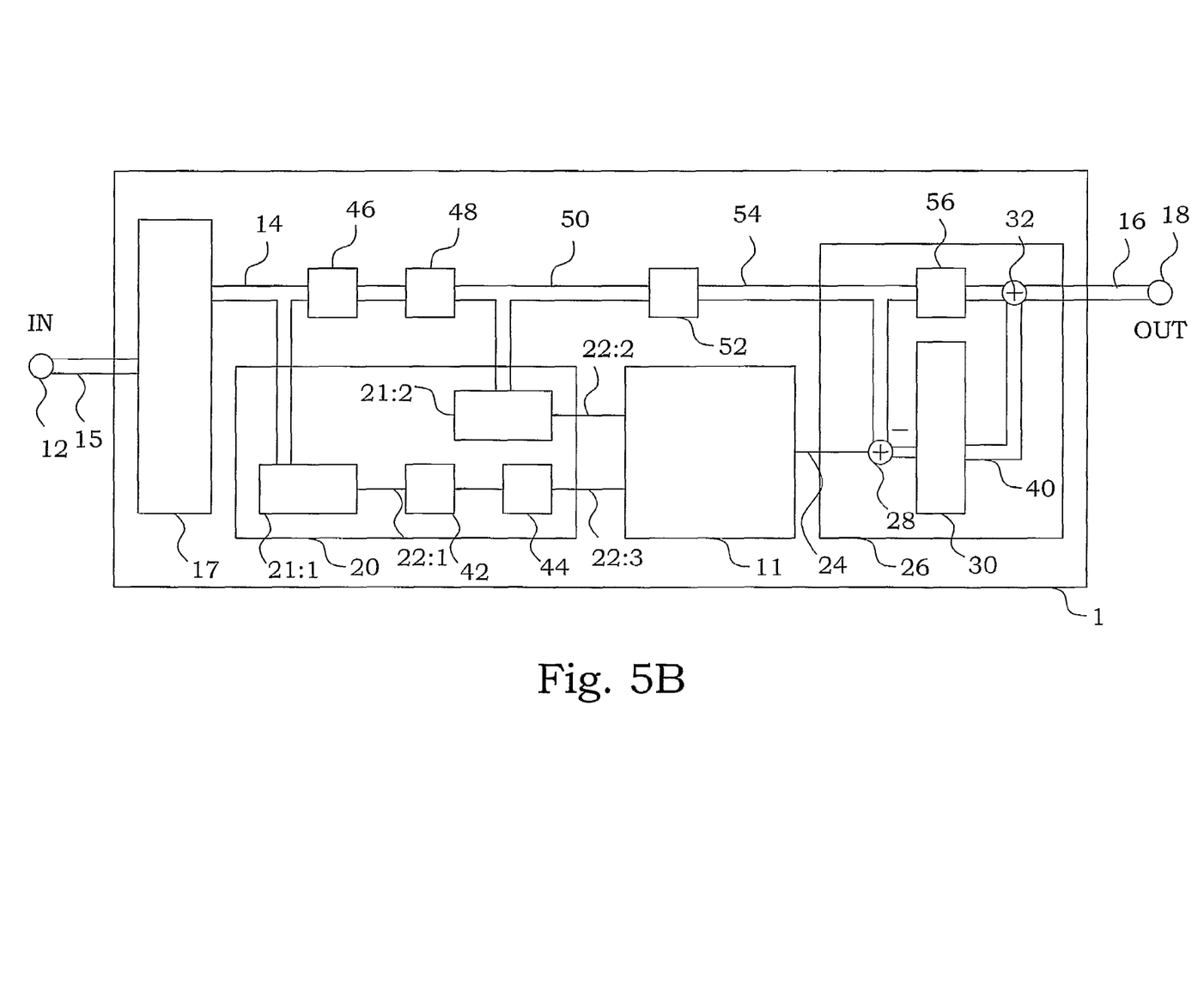
FIG. 5B is a block scheme of an embodiment of a supply voltage generator according to the present invention, suitable for an amplifier arrangement of FIG. 5A.

The envelope signal unit 69 is advantageously designed according to the present invention. An embodiment of such a non-linear processing envelope signal unit 1 is illustrated in FIG. 5B. An input 12 is provided with an input signal 15 of n bits. The input signal 15 is provided to an envelope detector 17, which detects an envelope signal 14 of the input signal 15. The envelope signal 14 is provided to a processor 46, giving a signal that is a function F2 of the signal envelope 14. This function output signal constitutes a seed signal to the rest of the arrangement. The function output signal is filtered in a filter 48 giving rise to a seed signal 50. The envelope signal 14 is also provided to the extractor 20, where the n bits signal is reduced to a k bit signal (k<n) 22:1 in a first extracting block 21:1. The low-precision k bits signal is provided to a processor 42, giving a signal that is a function F1 of the low-precision version of the signal envelope 14. The output from the processor 42 is then delayed in a delay unit 44 in order to be in phase with the reference signal 50. The output signal from the delay unit 44 is a low-precision reference signal 22:3 serving as the target for creating the requested output signal. The extractor 20 is also provided with the seed signal 50, which is connected to a second extraction block 21:2, giving a low-precision k bits reference signal 22:2 representing the seed signal 50.

The low-precision reference signal 22:3 and the low-precision seed signal 22:2 are provided to a low-precision non-linear processor 11, giving a low-precision output signal 24. The low-precision non-linear processor 11 preferably comprises a number of cascaded processing steps in order to find a suitable output signal. The seed signal 50 is delayed in a delay unit 52 for a time corresponding to the delay caused by the low-precision non-linear processor 11, giving a time synchronised seed signal 54. The time synchronised seed signal 54 and the low-precision output signal 24 are provided to the precision restoring processor 26.

The precision restoring processor 26 receives the low-precision output signal 24. A final peak extraction block 28 subtracts the n-bit seed signal 54 from the low-precision output signal 24, giving a difference signal. This difference signal is precision filtered, using all n bits in a filter 30, producing a peak suppression signal 40. Finally, the processed n-bit signal 16 is produced by adding the seed signal 54 and the filtered difference signal 40 in an addition block 32 and presented at the output 18. The seed signal 54 is further delayed in a delay unit 56 to be in phase with the filtered difference signal 40.

A seen in FIG. 5B, the transition to low precision of the envelope signal itself as input to the low-precision processing is preferably done after the generation and filtering of the seed signal 50. The filtered seed signal 50 is delayed in high-precision form by delay units 52 and 56, as shown in FIG. 5B. The signal after delay unit 52 is used for the final feature extraction and delay unit 56 delays the seed signal 54 to be in step at the final assembly (adder). The reference signal, typically the minimum envelope signal, can be changed to k-bit form before the nonlinear function F1, as shown by FIG. 5B. An alternative placement of the transition to k bits is after the processor 42 and the delay unit 44, whereby these two units has to operate on high precision signals instead.

Both PAR reduction and amplification according to dynamic drain bias principles according to prior art ideas requires relatively large supply of power. For co-locating for example PAR reduction or dynamic drain bias processing in the same ASIC or in the same FPGA as other baseband or intermediate frequency processing, even lower power consumption will be required. This can be achieved by applying the ideas of the present invention.

Figure 6:
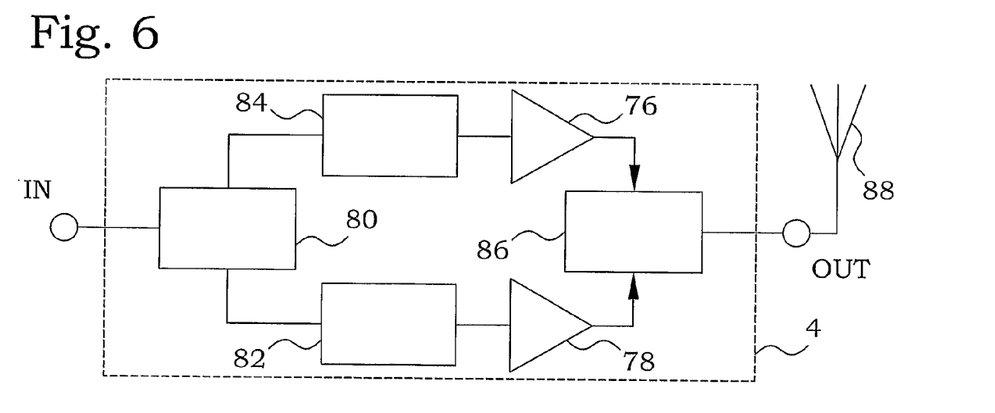
FIG. 6 is a block scheme of an embodiment of a Chireix amplifier arrangement.

There are further examples of systems where the present invention advantageously can be applied. The efficiency can be e.g. increased considerably in Doherty and Chireix PA systems. FIG. 6 illustrates a Chireix PA system 4. An input signal input is connected to two power amplifiers 76, 78 via a control network. The control network of a Chireix amplifier 4 typically comprises a signal component separator 80, producing phase-modulated constant-amplitude signals. These signals are upconverted in filters 82, 84, before being amplified in the power amplifiers 76, 78. A combiner network 86 combines the individual amplified signals into an output signal, provided to a load output, in this example connected to an antenna 88. The phases of these constant-amplitude signals are chosen so that the result from their vector-summation in the Chireix combiner network 86 yields the desired amplitude. All amplitudes from zero to full amplitude, as well as negative amplitudes, can be obtained in this way.

The flattened voltages at the amplifier drain terminals should exhibit minimal overshoots. Non-linear amplifier signals that fulfil this condition and stay within a limited bandwidth, and further increase efficiency, can be manufactured by using non-linear devices 82, 84 according to the present invention. A configuration and processing similar to that used in PAR reduction (FIG. 4) can be used. The boundary is constant and applied to the amplitude of the complex signals. Since the boundary is constant, there is no need for an accompanying reference non-linear signal.

Figure 7:
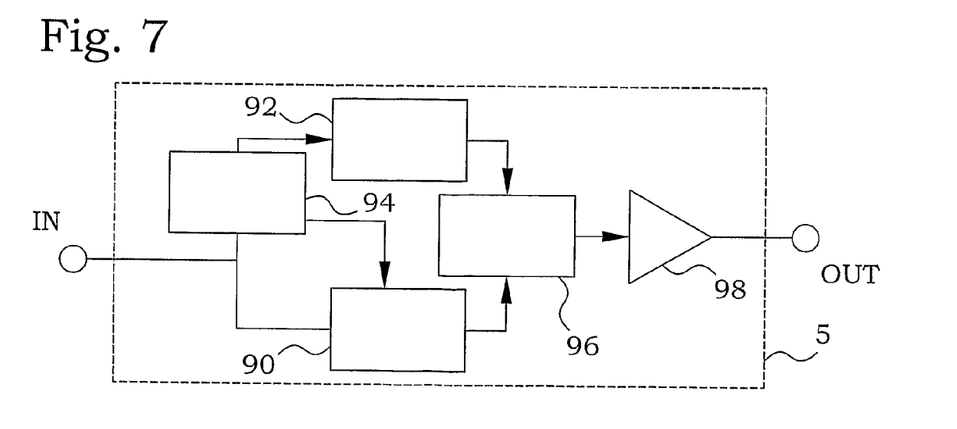
FIG. 7 is a block scheme of an embodiment of a dynamic gate bias amplifier arrangement.
Figure 8:
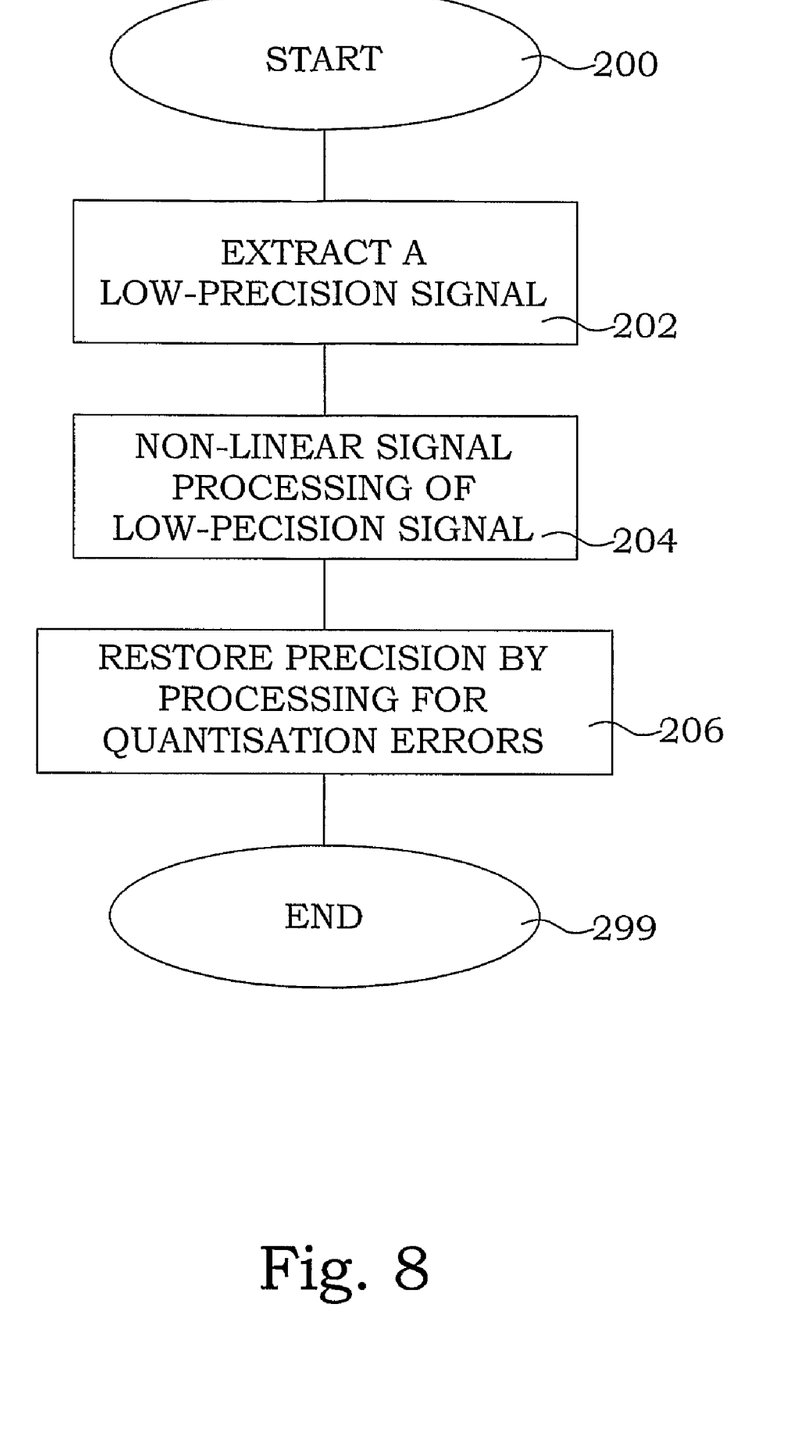
FIG. 8 is flow diagram of the main steps of an embodiment of a method according to the present invention.

Dynamic Gate Bias systems are another application suitable for the ideas of the present invention. FIG. 7 illustrates one embodiment of a Dynamic Gate Bias system 5. An input signal provided to the system 5 is intended to be amplified and provided as a radio frequency output signal. The input signal is connected to an input detector 94, which is arranged to determine an instantaneous (envelope) size measure of the input signal. An output of the input detector 94 is connected to a bias signal generator 92, which generates a bias signal to be used for providing the actual amplification operation. The bias signal generator 92 can thus provide a bias signal dependent on the input signal. The bias signal generator typically also comprises a bias amplifier. A signal dependent on the input signal is provided as a drive signal. The drive signal and the bias signal are matched in a matching unit 96 and provided to an amplifier 98, e.g. a power transistor, performing the actual amplification according to the selected drive signal and bias signal. A pre-distortion unit 90 is connected to the input signal and an output of the input detector for enabling a suitable pre-distortion of the input signal, typically for providing a linear output signal. An output signal is thus provided. By selecting the pre-distortion and the bias in an appropriate manner dependent on the size of the input signal, an efficient amplification can be achieved.

The ideal gate bias to a power transistor 98 is generally a non-monotonous function of the input amplitude. Limitations in the driver amplifier's output power gives a strict boundary to the bias function, and bandwidth limitations in the bias generating and amplifying circuits put restrictions also on the bandwidth. By applying and modifying the techniques used for dynamic drain bias (FIG. 5B), the bias signal generator 92 can more efficiently provide signals in turn giving a more efficient amplification.

In the embodiments, described above, digital signals have been assumed. However, the present invention can also be applied to analogue signals. When processing an analogue signal with a low precision non-linearly, different artefacts are produced due to the low precision. The precision restoring in analogue applications aims to remove any such precision-related artefacts.

The main advantage of the present invention is a large reduction in computational cost. Especially filter processing stages in cascaded nonlinear/filter steps require lots of multiplications and additions per signal sample. A reduction to half the number of bits in the processing, which can be a typical figure for actual implementations, reduces the size of a multiplier by a factor of four, if the same clock rate is maintained. The power consumption is typically proportional to the size, e.g. number of gates, so both the chip area and power consumption are reduced significantly by the invention. An extra filtering stage is needed, to restore precision in the end of the chain, but this usually has a marginal cost compared to what is gained by reduced precision in the processing branch.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A method for nonlinear processing of signals under constraints, comprising the steps of:
   extracting, from an input signal, a low-precision version of the input signal having reduced precision compared to the input signal;
   nonlinear processing of the low-precision signal under the constraints; and,
   precision restoring of the nonlinear processed low-precision signal;
   wherein the step of precision restoring comprises the steps of processing of a difference between the nonlinear processed low-precision signal and a reference signal, for reducing artifacts introduced by low-precision processing, and adding the processed difference to the reference signal.

2. The method according to claim 1, wherein the reference signal is dependent on the input signal.

3. The method according to claim 1, wherein the step of nonlinear processing comprises a cascade of processing stages.

4. The method according to claim 1, wherein the nonlinear processing of signals under constraints is associated with peak-to-average ratio reduction.

5. The method according to claim 1, wherein the nonlinear processing of signals under constraints is associated with signal conditioning in a Doherty and/ or Chireix amplifier system.

6. The method according to claim 1, wherein the nonlinear processing of signals under constraints is associated with signal conditioning in a dynamic drain bias system.

7. The method according to claim 1, wherein the nonlinear processing of signals under constraints is associated with signal conditioning in a dynamic gate bias amplifier system.

8. The method according to claim 1, wherein the input signal is a digital signal.

9. A device for nonlinear processing of signals under constraints, comprising:
   an extractor, connected to an input signal, arranged for providing a low-precision version of the input signal having reduced precision compared to the input signal;
   a nonlinear processor for receiving the low-precision signal and operative to give a nonlinear processed low-precision signal; and,
   a precision restoring processor, connected to a signal representative to the nonlinear processed low-precision signal;
   wherein the precision restoring processor is arranged for processing a full precision difference between the nonlinear Processed low-precision signal and a reference signal, for reducing artifacts introduced by low-precision processing, and adding the processed difference to the reference signal.

10. The device according to claim 9, further comprising a reference signal generator connected to a signal representative of the input signal.

11. The device according to claim 9, wherein the nonlinear processor comprises a cascade of processor stages.

12. The device according to claim 9, wherein the input signal is a digital signal.

13. System for peak-to-average ratio reduction, comprising a device according to claim 9.

14. Amplifier system of a Doherty and/or Chireix type, comprising a device according to claim 9.

15. Dynamic drain bias amplification system, comprising a device according to claim 9.

16. Dynamic gate bias amplifier system, comprising a device according to claim 9.

* * * * *